US009818623B2

(12) United States Patent
Stephens et al.

(10) Patent No.: US 9,818,623 B2
(45) Date of Patent: Nov. 14, 2017

(54) METHOD OF FORMING A PATTERN FOR INTERCONNECTION LINES AND ASSOCIATED CONTINUITY BLOCKS IN AN INTEGRATED CIRCUIT

(71) Applicant: GLOBALFOUNDRIES Inc., Grand Cayman (KY)

(72) Inventors: Jason Eugene Stephens, Menands, NY (US); Guillaume Bouche, Albany, NY (US); Byoung Youp Kim, Schenectady, NY (US); Craig Michael Child, Jr., Gansevoort, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/077,480

(22) Filed: Mar. 22, 2016

(65) Prior Publication Data

US 2017/0278720 A1 Sep. 28, 2017

(51) Int. Cl.
*H01L 21/302* (2006.01)
*H01L 21/3213* (2006.01)
*H01L 21/32* (2006.01)

(52) U.S. Cl.
CPC ........ *H01L 21/32136* (2013.01); *H01L 21/32* (2013.01); *H01L 21/32139* (2013.01)

(58) Field of Classification Search
CPC ............... H01L 21/308; H01L 21/0337; H01L 21/0338; H01L 21/3088; H01L 21/31144; H01L 21/32139; H01L 21/3086; H01L 21/32

USPC ....... 438/168, 270, 655, 706, 714, 719, 723, 438/736

See application file for complete search history.

(56) References Cited

U.S. PATENT DOCUMENTS

| | | | |
|---|---|---|---|
| 6,455,436 B1 | 9/2002 | Ueda et al. | |
| 7,183,142 B2 | 2/2007 | Anderson et al. | |
| 8,298,943 B1 | 10/2012 | Arnold et al. | |
| 8,518,824 B2 | 8/2013 | Arnold et al. | |
| 8,999,848 B2 * | 4/2015 | Lee | H01L 21/4846 257/E21.039 |
| 9,012,287 B2 | 4/2015 | Liaw | |
| 9,123,656 B1 * | 9/2015 | Hsieh | H01L 21/3086 |

(Continued)

OTHER PUBLICATIONS

U.S. Appl. No. 15/271,475, filed Sep. 21, 2016.

(Continued)

*Primary Examiner* — Lan Vinh
(74) *Attorney, Agent, or Firm* — Heslin Rothenberg Farley & Mesiti P.C.

(57) ABSTRACT

A method for forming a pattern for interconnection lines and associated continuity dielectric blocks in an integrated circuit includes providing a structure having a mandrel layer disposed over an etch mask layer, the etch mask layer being disposed over a pattern layer and the pattern layer being disposed over a dielectric stack. Patterning an array of mandrels in the mandrel layer. Selectively etching a beta trench entirely in a mandrel of the array, the beta trench overlaying a beta block mask portion of the pattern layer. Selectively etching a gamma trench entirely in the etch mask layer, the gamma trench overlaying a gamma block mask portion of the pattern layer. Selectively etching the structure to form a pattern in the pattern layer, the pattern including the gamma and beta block mask portions.

17 Claims, 16 Drawing Sheets

(56) References Cited

U.S. PATENT DOCUMENTS

| | | |
|---|---|---|
| 9,136,106 B2 | 9/2015 | Wu et al. |
| 9,209,279 B1 | 12/2015 | Zhang et al. |
| 9,406,775 B1 | 8/2016 | Bouche et al. |
| 2005/0215040 A1 | 9/2005 | Doyle |
| 2006/0055045 A1 | 3/2006 | Park et al. |
| 2008/0193658 A1 | 8/2008 | Millward |
| 2008/0227298 A1 | 9/2008 | Hirota |
| 2011/0240596 A1 | 10/2011 | Millward |
| 2011/0256723 A1 | 10/2011 | Lee et al. |
| 2011/0316125 A1 | 12/2011 | Thomas |
| 2012/0118854 A1 | 5/2012 | Smayling et al. |
| 2012/0132988 A1 | 5/2012 | Lui et al. |
| 2013/0196517 A1 | 8/2013 | Tsujita et al. |
| 2013/0244344 A1 | 9/2013 | Malmhall et al. |
| 2013/0329486 A1* | 12/2013 | Juengling ............. H01L 27/105 365/149 |
| 2014/0038428 A1 | 2/2014 | Huang et al. |
| 2014/0054534 A1 | 2/2014 | Pellizzer et al. |
| 2014/0170853 A1* | 6/2014 | Shamma ........... H01L 21/02115 438/699 |
| 2014/0258961 A1 | 9/2014 | Ke et al. |
| 2014/0273363 A1 | 9/2014 | Chiu et al. |
| 2014/0273464 A1 | 9/2014 | Shieh et al. |
| 2015/0056800 A1 | 2/2015 | Mebarki et al. |
| 2015/0072527 A1 | 3/2015 | Ng et al. |
| 2015/0087149 A1 | 3/2015 | He et al. |
| 2015/0108087 A1 | 4/2015 | Somervell et al. |
| 2015/0140811 A1 | 5/2015 | Huang et al. |
| 2015/0147882 A1 | 5/2015 | Yao et al. |
| 2015/0179652 A1 | 6/2015 | Wang et al. |
| 2015/0243654 A1 | 8/2015 | Thong et al. |
| 2015/0318173 A1 | 11/2015 | Shih et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1 | 4/2016 | Zhana et al. |
| 2016/0225634 A1 | 8/2016 | Anderson et al. |
| 2016/0254191 A1 | 9/2016 | Tseng et al. |
| 2017/0221702 A1 | 8/2017 | Lee et al. |

OTHER PUBLICATIONS

U.S. Appl. No. 15/271,497, filed Sep. 21, 2016.
U.S. Appl. No. 15/271,519, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/379,740, filed Dec. 15, 2016.
U.S. Appl. No. 15/362,035, filed Nov. 28, 2016.
U.S. Appl. No. 15/053,818, filed Feb. 25, 2016.
U.S. Appl. No. 15/077,564, filed Mar. 22, 2016.
U.S. Appl. No. 15/077,384, filed Mar. 22, 2016.

* cited by examiner

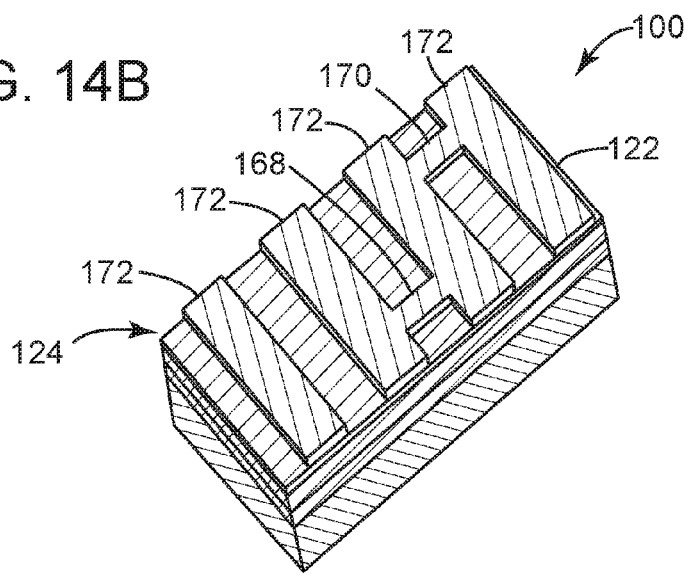
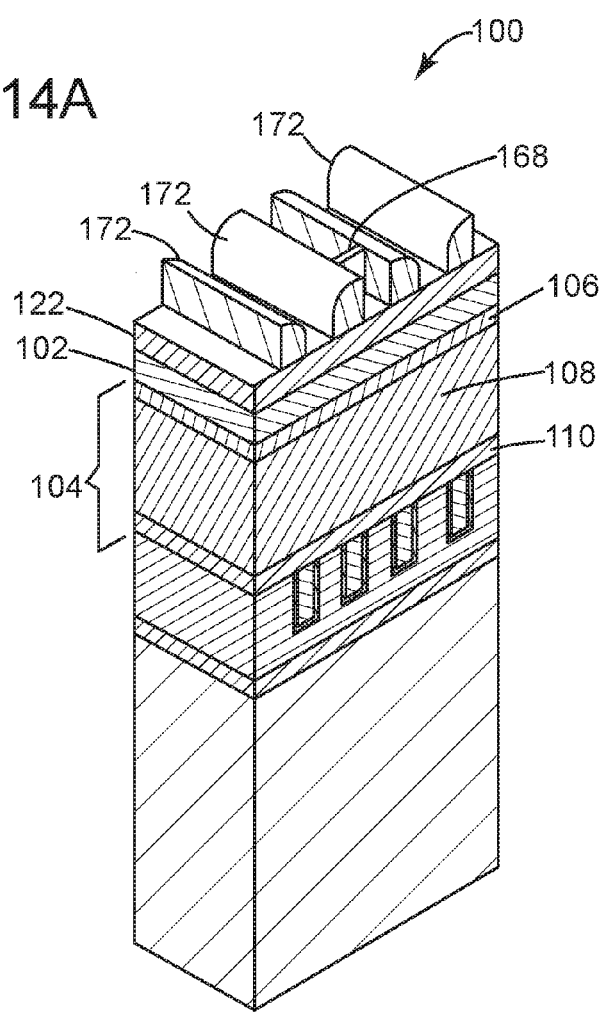

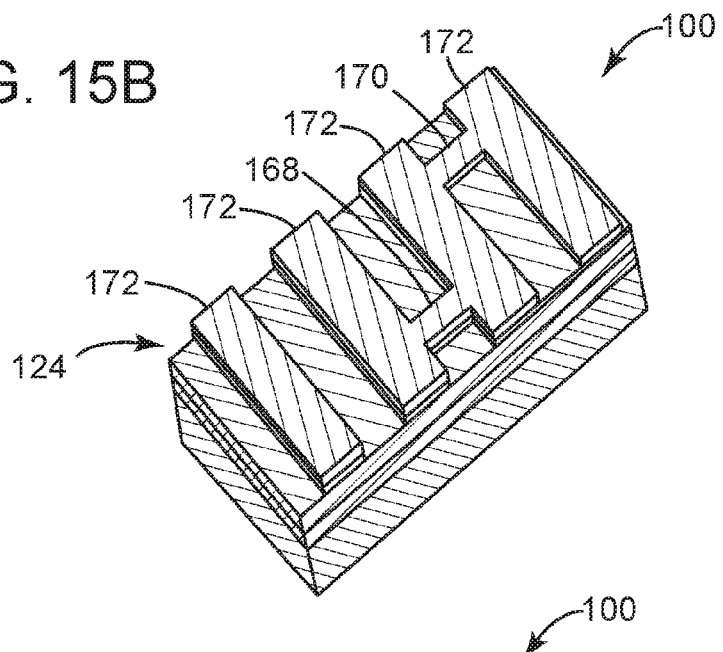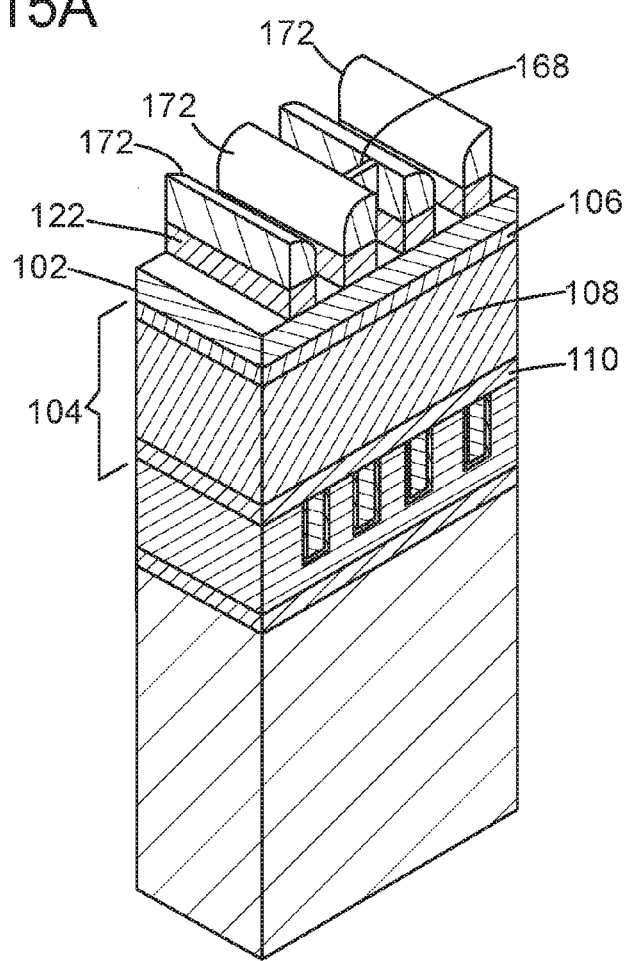

METHOD OF FORMING A PATTERN FOR INTERCONNECTION LINES AND ASSOCIATED CONTINUITY BLOCKS IN AN INTEGRATED CIRCUIT

TECHNICAL FIELD

The present invention relates to semiconductor devices and methods of fabricating the same. More specifically, the invention relates to various methods of forming patterns for electrical interconnection systems in integrated circuits.

BACKGROUND

With constant down-scaling and increasingly demanding requirements to the speed and functionality of ultra-high density integrated circuits, semiconductor devices, such as transistors, diodes, capacitors and the like, need ever more complex and densely packaged electrical interconnection systems between devices. The conventional process of manufacturing such interconnection systems has been to use a series of lithographic processes to pattern and dispose metal interconnection lines and vias on a dielectric layer to form a metallization layer. The metallization layer would be disposed above a substrate having active semiconductor devices embedded therein and the interconnection system would provide the contacts and interconnections between those devices.

Previously, the lithography process was carried out on a two-dimensional (2D) scale, that is, on a single metallization layer, wherein geometrically complex patterns were disposed on one level to form the interconnections between devices. However, at about a pitch of 90 nanometers (nm), the resolution of current lithographic processes becomes blurred enough to make such complex patterning unreliable. This is especially the case in the first two metallization layers (M1 and M2) where metallization is the densest.

Therefore, as illustrated in exemplary prior art FIG. 1, at lower technology class sizes, such as the 10 nm class and lower, self-aligned double patterning (SAPD) processes are now used to provide an interconnection system 10 which includes multiple levels of arrays of parallel pairs of straight metalized trenches (or interconnect lines) 12 and 14 disposed in dielectric layers 16. The array of interconnect lines 12 and 14 of each dielectric layer 16 are often oriented at 90 degree angles relative to the arrays of the adjacent dielectric layers (not shown). The multiple dielectric layers are connected with a system of vias, such that, once the trenches and vias are metallized, there is electrical continuity between levels of the interconnection system 10.

In order to provide device functionality, a plurality of non-aligned dielectric blocks 18 and 20, which block the electric continuity of neighboring interconnection lines 12 and 14, are patterned into the dielectric layer at specific locations to direct current flow between the dielectric layers 16 and devices. The blocks 18 and 20 are patterned into the dielectric layer 16 through a series of lithographic processes. In the exemplary ideal case, as shown in FIG. 1, the lithographic processes are perfectly aligned such that block 18 interrupts the precise active interconnect line 12 it is associated with, without extending into any neighboring interconnect line 14. Additionally block 20 interrupts its interconnect line 14 without extending into any neighboring line 12.

Problematically, lithographic misalignment, or overlay, is a significant issue at lower technology node sizes, such as when the technology class size is no greater than 10 nm or when the repetitive pitch distance is no greater than 40 nm. Overlay is a measure of how well two lithographic layers (or steps) align. Overlay can be in the X or Y direction and is expressed in units of length.

In mass production, the lithographically disposed dielectric blocks 18 and 20 must be large enough to make sure that they always cut the active line they are supposed to (i.e., lines 12 and 14 respectively) without clipping any neighboring lines, taking into account the overlay control for the worst 3 sigma case. In an exemplary worst 3 sigma case scenario, as shown in prior art FIG. 2, for at least the 10 nm class or less or for a pitch of 40 nm or less, the current state of the art 3 sigma overlay control is not precise enough to prevent dielectric blocks 18 and 20 from over-extending into active neighboring lines in an acceptably few number of cases. That is, the failure rate of blocks 18 extending into adjacent lines 14 and blocks 20 extending into adjacent lines 12 will be outside of the industry acceptable 3 sigma standard.

The unwanted over-extension of blocks 18 (which are supposed to cut lines 12 only) into neighboring lines 14, and over-extension of blocks 20 (associated with lines 14) into neighboring lines 12 can, in the worst case condition, completely interrupt electrical continuity in the wrong line. Additionally, a line that is inadvertently only partially cut may still conduct for a time, but will over heat and prematurely fail.

Accordingly, there is a need for a method of patterning interconnection lines that is tolerant of lithographic misalignment or overlay. Additionally, there is a need for a method that is capable of patterning dielectric blocks between interconnection lines such that the blocks do not clip neighboring lines.

BRIEF DESCRIPTION

The present invention offers advantages and alternatives over the prior art by providing a method that is capable of forming a pattern for interconnection lines and associated continuity dielectric blocks in an integrated circuit. The pattern includes alternating beta and gamma regions for forming beta and gamma interconnect lines. The pattern also includes at least one beta block mask portion for forming a continuity beta dielectric block across a beta line, wherein the beta dielectric block does not extend into a gamma line. The pattern further includes at least one gamma block mask portion for forming a continuity gamma dielectric block across a gamma line, wherein the gamma dielectric block does not extend into a beta line.

A method of forming a pattern in accordance with one or more aspects of the present invention includes providing a structure having a mandrel layer disposed over an etch mask layer, the etch mask layer being disposed over a pattern layer and the pattern layer being disposed over a dielectric stack. Patterning an array of mandrels in the mandrel layer. Selectively etching a beta trench entirely in a mandrel of the array, the beta trench overlaying a beta block mask portion of the pattern layer. Selectively etching a gamma trench entirely in the etch mask layer, the gamma trench overlaying a gamma block mask portion of the pattern layer. Selectively etching the structure to form a pattern in the pattern layer, the pattern including the gamma and beta block mask portions.

In another exemplary embodiment of the invention a method includes providing a structure having a mandrel layer disposed over an etch mask layer, the etch mask layer being disposed over a pattern layer and the pattern layer being disposed over a dielectric stack. Patterning an array of mandrels in the mandrel layer. Selectively etching a beta trench entirely in a mandrel of the array, the beta trench overlaying a beta block mask portion of the pattern layer. Selectively etching a gamma trench entirely in the etch mask layer, the gamma trench overlaying a gamma block mask portion of the pattern layer. Disposing a spacer layer over the structure, the spacer layer forming a beta trench plug in the beta trench and a gamma trench plug in the gamma trench. Anisotropically etching the spacer layer to expose the beta and gamma trench plugs, and form an array of spacers disposed on sidewalls of the mandrels. Selectively etching the structure to form a pattern in the pattern layer, the pattern including the gamma and beta block mask portions.

DRAWINGS

The invention will be more fully understood from the following detailed description taken in conjunction with the accompanying drawings, in which:

FIG. 14A is a perspective view of the structure of FIG. 13A having the mandrels anisotropically etched away in accordance with the present invention;

FIG. 14B is a top perspective view of FIG. 14A;

FIG. 15A is a perspective view of the structure of FIG. 14A having the exposed portion of the etch mask layer etched away in accordance with the present invention;

FIG. 15B is a top perspective view of FIG. 15A;

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 3-16 illustrate various exemplary embodiments of methods of forming patterns for interconnection lines and associated continuity blocks for integrated circuits in accordance with the present invention.

Figure 1:
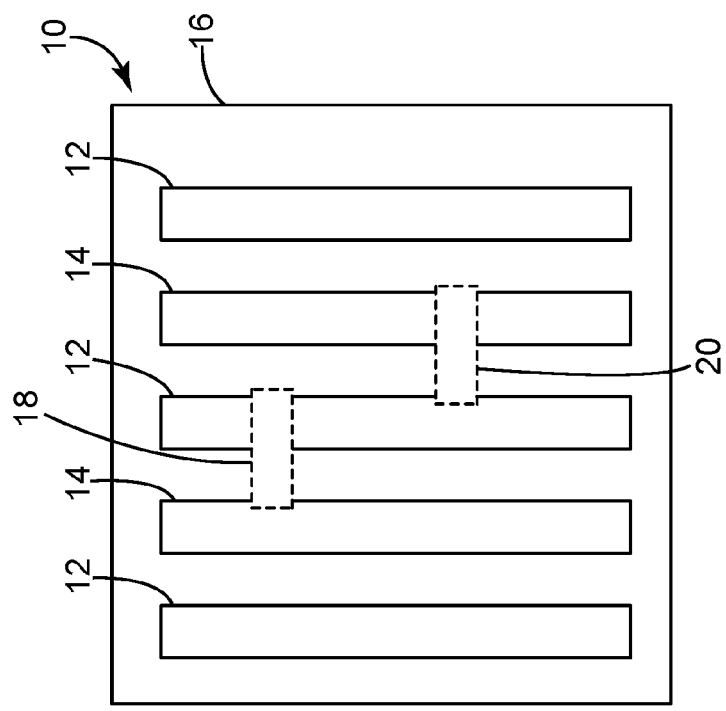
FIG. 1 is a simplified top view of an exemplary embodiment of an ideal case prior art interconnection system with aligned dielectric blocks.
Figure 2:
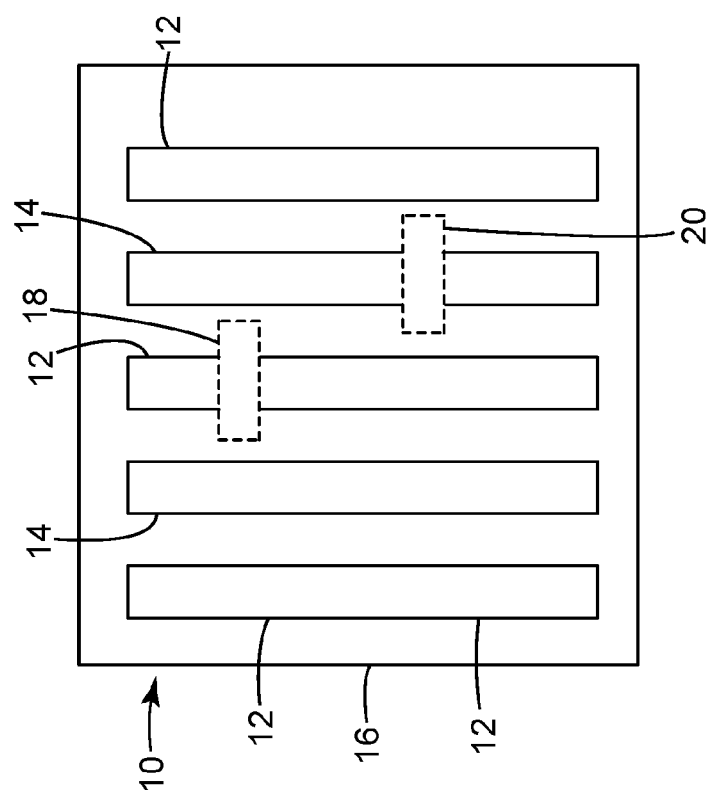
FIG. 2 is a simplified top view of an exemplary embodiment of a worst case prior art interconnection system with misaligned dielectric blocks.
Figure 3:
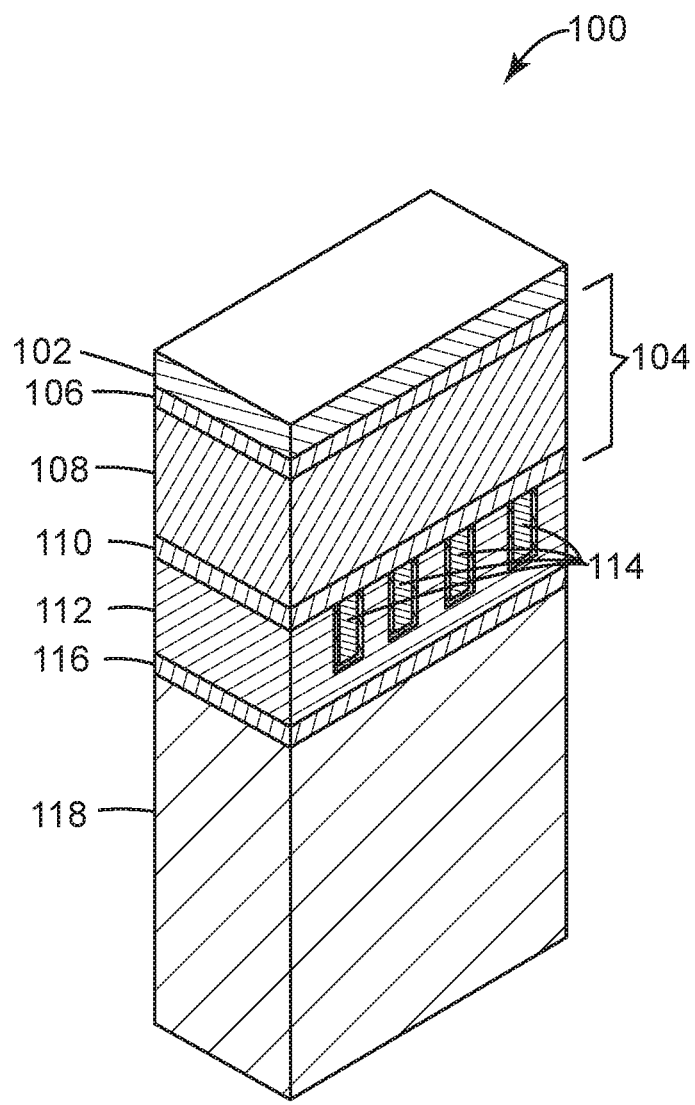
FIG. 3 is simplified perspective view of an exemplary embodiment of a structure for an integrated circuit device having a pattern layer disposed over a dielectric stack in accordance with the present invention.

Referring to FIG. 3, a simplified view of an exemplary embodiment of a structure 100 for an integrated circuit device in accordance with the present invention is presented at an intermediate stage of manufacturing. Structure 100 includes a titanium nitride (TiN) pattern layer 102 disposed over a dielectric stack 104. The dielectric stack 104 may include many different combinations of layers depending on such factors as application requirements, cost, design preferences and the like. In this exemplary embodiment, the dielectric stack 104 includes a first silicon oxynitride dielectric layer (first SiON dielectric layer) 106 disposed over a low dielectric constant (k) layer 108, such as a dielectric layer composed of various combinations of silicon, carbon, oxygen and hydrogen (an SiCOH layer). The low k dielectric layer 108 is disposed over an etch-stop layer 110, such as a silicon nitride (SiN) layer, which is also included in the dielectric stack 104.

The dielectric stack 104 is disposed over a metallization layer 112, which contains a plurality of interconnect lines 114 that make up a portion of an electrical interconnection system for structure 100. Metallization layer 112, in turn, is disposed over a second SiN etch stop layer 116. The second etch stop layer 116 is disposed over a complex stack of buried layers 118 from the substrate (not shown) upwards.

Figure 4:
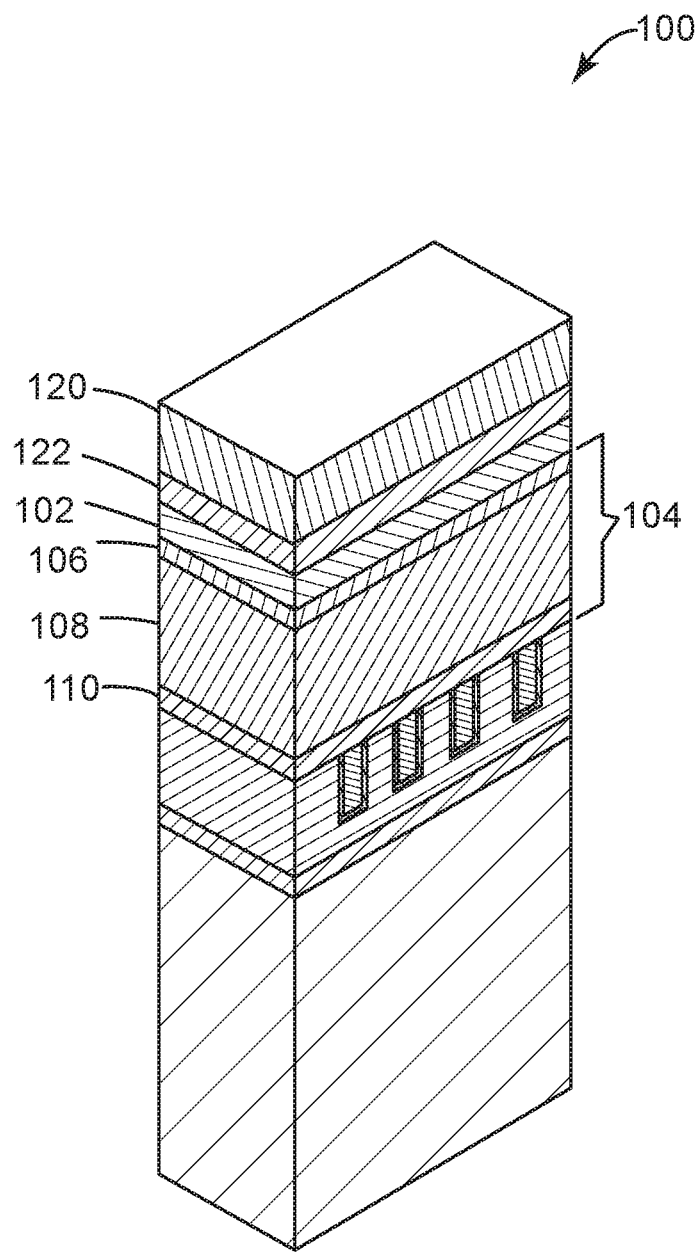
FIG. 4 is a perspective view of an exemplary embodiment of the structure of FIG. 3 having a mandrel layer and an etch mask layer disposed on the pattern layer in accordance with the present invention.

Referring to FIG. 4, an etch mask layer 122, composed of SiN, is disposed over pattern layer 102. Then a mandrel layer 120, composed of an amorphous silicon (a-Si), is disposed over the etch mask layer 122.

The function of the mandrel layer 120 and etch mask layer 122 is to isolate distinct geometric features which can be formed into the separated layers 120, 122 in a series of processes. The features can ultimately be processed to be combined into the pattern layer 102 to form a pattern 124, as best illustrated in FIG. 5.

Figure 5:
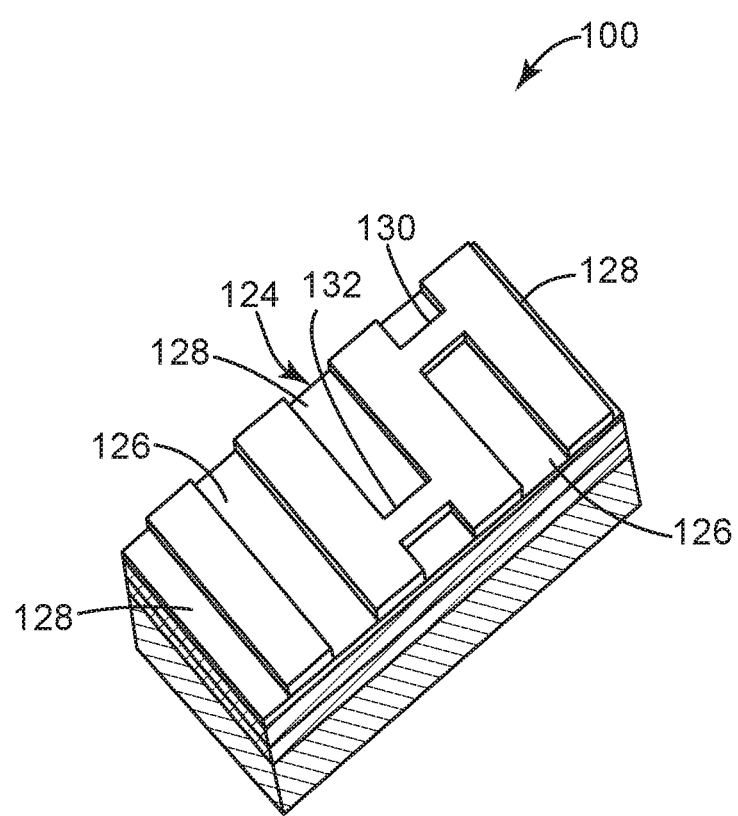
FIG. 5 is simplified perspective view of an exemplary embodiment of a pattern for an interconnection system in accordance with the present invention.

Referring to FIG. 5, as will be discussed in greater detail herein, the pattern 124 will be used to etch an array of parallel trenches into the low k dielectric layer 108 of the dielectric stack 104, which will later be metalized to form interconnect lines that are at least a portion of the electrical interconnection system of structure 100. More specifically, pattern 124 defines locations of gamma interconnect lines 126 disposed in a gamma region of the low k dielectric layer 108. Additionally, the pattern 124 defines locations of beta interconnect lines 128 disposed in a beta region of the low k dielectric layer 108. The pattern 124 includes certain gamma block mask portions 130, that define locations of gamma blocks in the low k dielectric layer 108, which block electrical continuity of the gamma interconnect lines 126. The gamma blocks extend across the entire width of the gamma region but do not extend into the beta region where they can cut a beta interconnect line 128. The pattern also includes beta block mask portions 132, that define locations of beta blocks in the low k dielectric layer 108, which block electrical continuity of beta interconnect lines 128. The beta blocks extend across the entire width of the beta region but do not extend into the gamma region where they can cut a gamma interconnect line 126.

Figure 6:
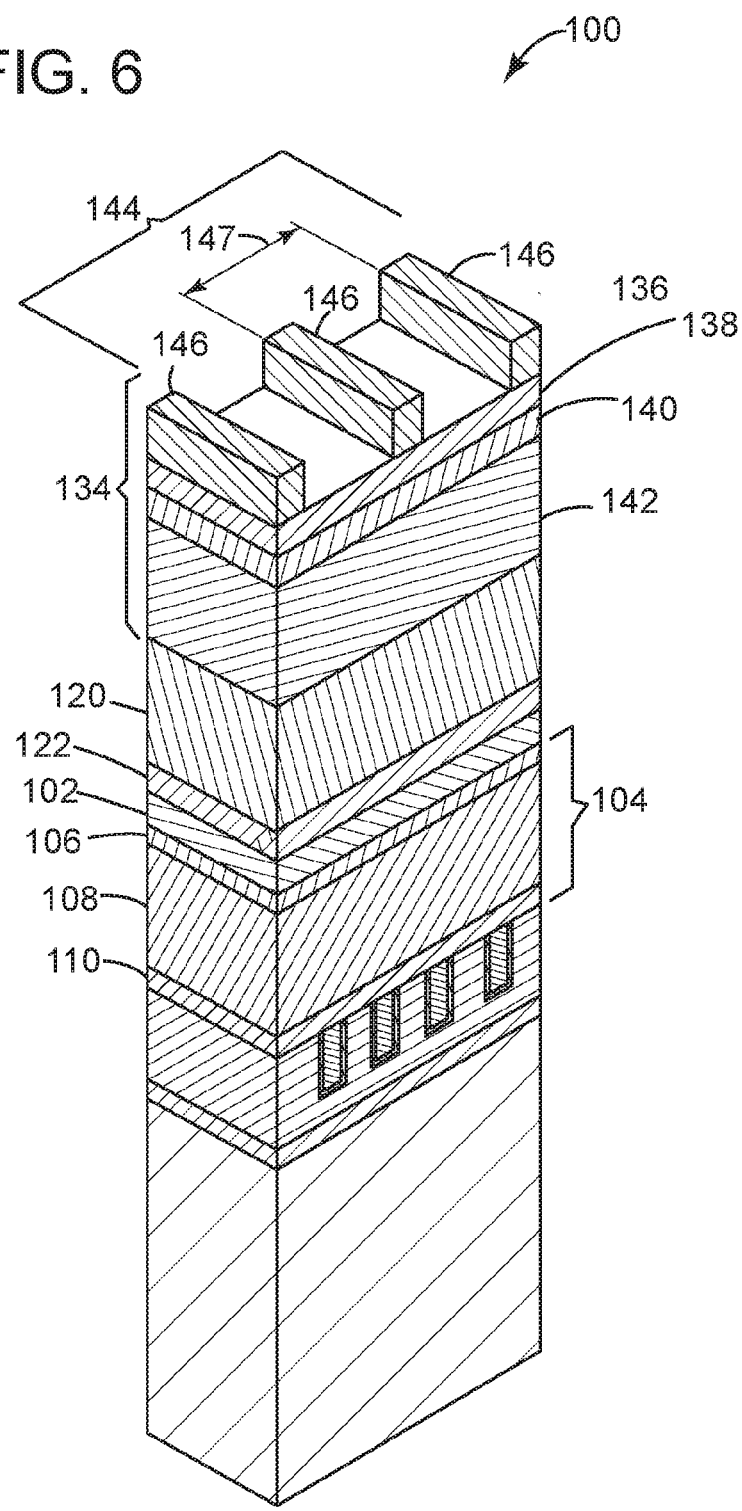
FIG. 6 is perspective view of an exemplary embodiment of the structure of FIG. 4 having a lithographic stack with mandrels patterned thereon in accordance with the present invention.

Referring to FIG. 6, once the mandrel layer 120 and etch mask layer 122 have been disposed over the pattern layer 102, the next step is to dispose a lithographic stack 134 onto the mandrel layer 120. The lithographic stack 134 can be composed of several different kinds of layers, depending on such parameters as the application requirements, design or proprietary preferences or the like. One such stack of layers includes a stack of four thin films which includes (from top to bottom) a resist layer 136, a bottom antireflective coating (BARC) layer 138, a second SiON dielectric layer 140 and a spin-on hardmask (SOH) layer 142. This SOH layer is typically made of amorphous carbon.

Once the stack 134 is disposed over the mandrel layer 120, a parallel array 144 of mandrels 146 are patterned into the resist layer 136 of the lithographic stack 134 through well-known lithographic techniques. Note that in this exemplary embodiment, a pitch 147 (i.e., the center to center distance between repetitive features on an integrated circuit) between mandrels is set at 80 nm.

Figure 7:
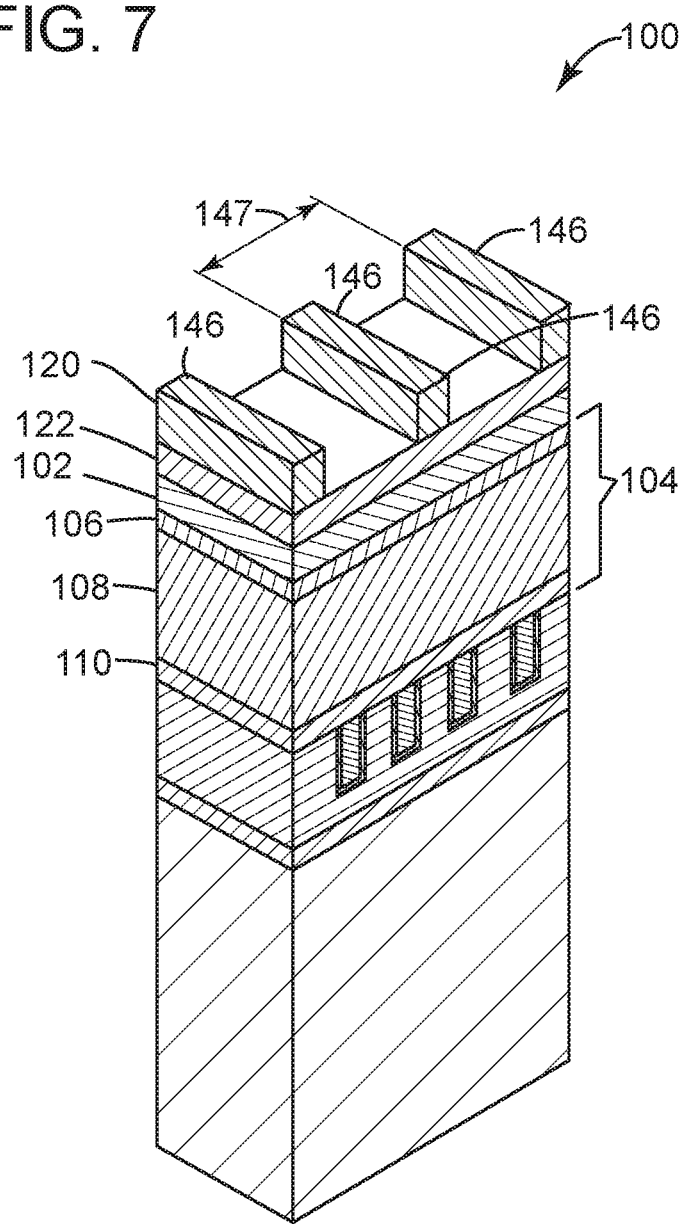
FIG. 7 is a perspective view of an exemplary embodiment of the structure of FIG. 6 having the mandrels patterned into the mandrel layer.

Referring to FIG. 7, the mandrels 146 are then etched and trimmed, by a variety of well-known processes, to reduce the width (indicated by arrow 148) of the mandrels 146 to, in this example, substantially 20 nm and to extend the mandrels down to the mandrel layer 120. It is important to note that even though the width 148 of the mandrels 146 has been reduced to 20 nm, the pitch 147 of 80 nm has not changed.

It is also important to note that the mandrel layer 120 (and therefore the mandrels 146) and the etch mask layer 122 have different material compositions in order to be able to selectively etch features into each in the following steps. In this particular exemplary embodiment, silicon nitride (SiN) was chosen for the material of the etch mask layer 122 and amorphous silicon (a-Si) was chosen for the material of the mandrels 146. However, one skilled in the art would recognize that many other materials can be used. What is necessary is that the material for the etch mask layer 122 be different enough from the material of the mandrels 146 such that the two materials will have different etch rates for different etch processes. More preferably, the materials should be different enough such that the etch mask layer 122 is readily etched and the mandrels 146 are not etched at all by a first etch process, while the mandrels 146 are readily etched and the etch mask layer 122 is not etched at all for a different second etch process. In this manner, the mandrels 146 and etch mask layer 122 can be selectively etched in the various remaining steps.

Figure 8:
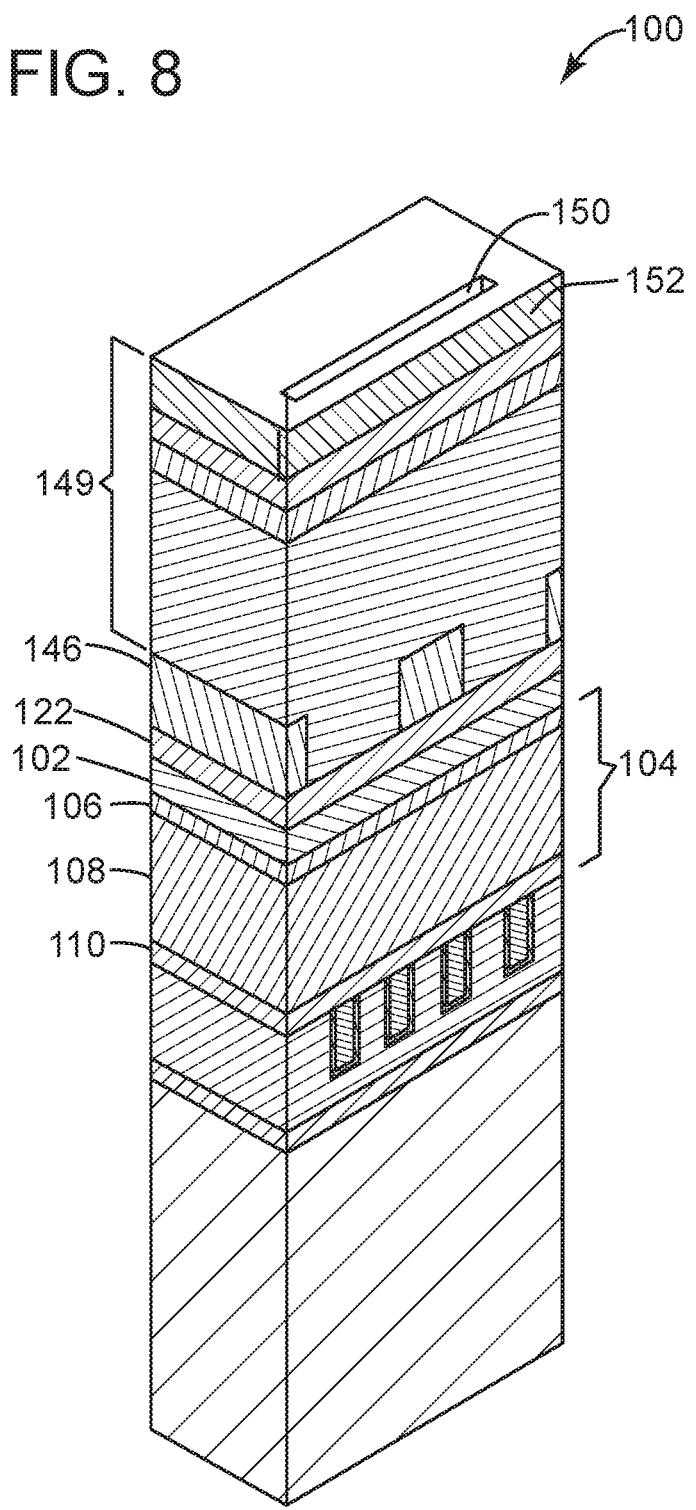
FIG. 8 is a perspective view of an exemplary embodiment of the structure of FIG. 7 having a lithographic stack with a first cut patterned therein in accordance with the present invention.

Referring to FIG. 8, a second lithographic stack 149 is disposed over the structure 100. A first cut 150 is then patterned into a predetermined location of resist layer 152 of the stack 149.

Figure 9B:
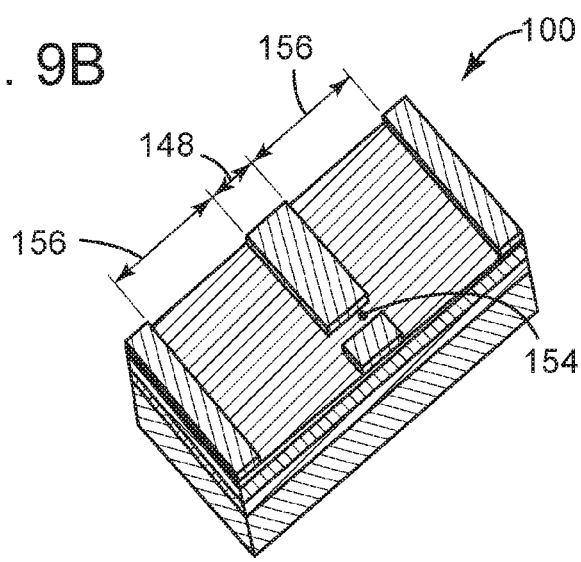
FIG. 9B is a perspective top view of FIG. 9A.
Figure 9A:
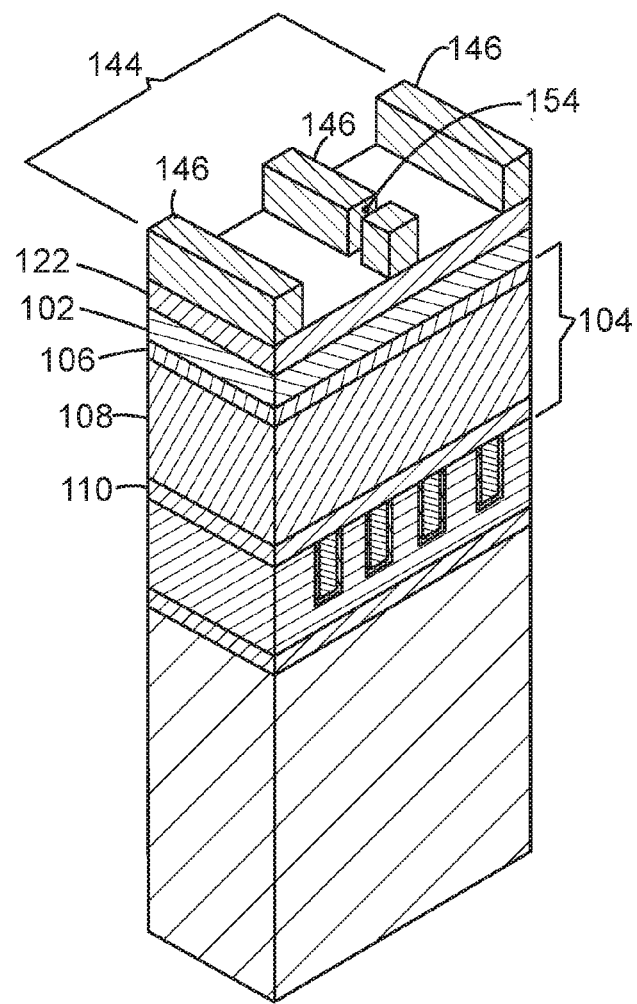
FIG. 9A is a perspective view of an exemplary embodiment of the structure of FIG. 8 having a beta trench in a mandrel in accordance with the present invention.

Referring to FIGS. 9A and B, once the lithographic process is complete and the cut 150 is notched into the resist layer 152, an anisotropic etch process, such as a reactive ion etch (RIE), is utilized to selectively etch a beta trench 154 entirely in a mandrel 146 of the array 144. The beta trench 154 is located such that it overlays the beta block mask portion 132 of pattern 124 in the pattern layer 102 (best seen in FIG. 5). The beta block mask portion 132 will ultimately be utilized to form an electrical continuity block (a beta block) to a beta interconnect line in the low k dielectric layer 108 of dielectric stack 104. Therefore for reasons previously discussed, it is imperative that the beta trench 154 be precisely located such that it does not over extend into neighboring interconnect lines.

Because the material composition of the mandrels 146 and etch mask layer 122 are different, the etching process which formed beta trench 154 can be selected such that it affects only the a-Si mandrels 146 and not the SiN etch mask layer 122. Therefore, the overlay control of the lithographic process, which was used to size and locate the beta trench 154, must be accurate enough to prevent the etching process from over extending past the entire width (as indicated by width arrow 156) of the exposed etch mask layer 122 between mandrels 146.

Advantageously, since the pitch 147 at this stage of the process is 80 nm, it is well within the state of the art of conventional lithographic overlay control to prevent such over extension. More specifically, for this example, if the pitch 147 is at 80 nm and the mandrels 146 have a width 148 of 20 nm, then the width 156 of the exposed etch mask layer 122 between those mandrels must be 60 nm. Having a tolerance of 60 nm on either side of a targeted 20 nm etch is well within the control of a state of the art lithographic process. Moreover, since the width 148 of the mandrels 146 essentially define the width of the beta trench 154, the beta trench can be considered to be self-aligned.

Though this exemplary embodiment shows a single beta trench 154 being etched entirely into a mandrel 146, one skilled in the art would recognize that a plurality of beta trenches may be etched into that same mandrel. This can be particularly helpful when beta blocks must be constructed in an electrical interconnection system wherein they are separated by only a small distance, such as 100 nm or less. In such cases, multiple beta trenches (for example a first beta trench and a parallel second beta trench) may be etched into the mandrel 146 wherein the trenches are separated by a distance of 100 nm or less.

Figure 10:
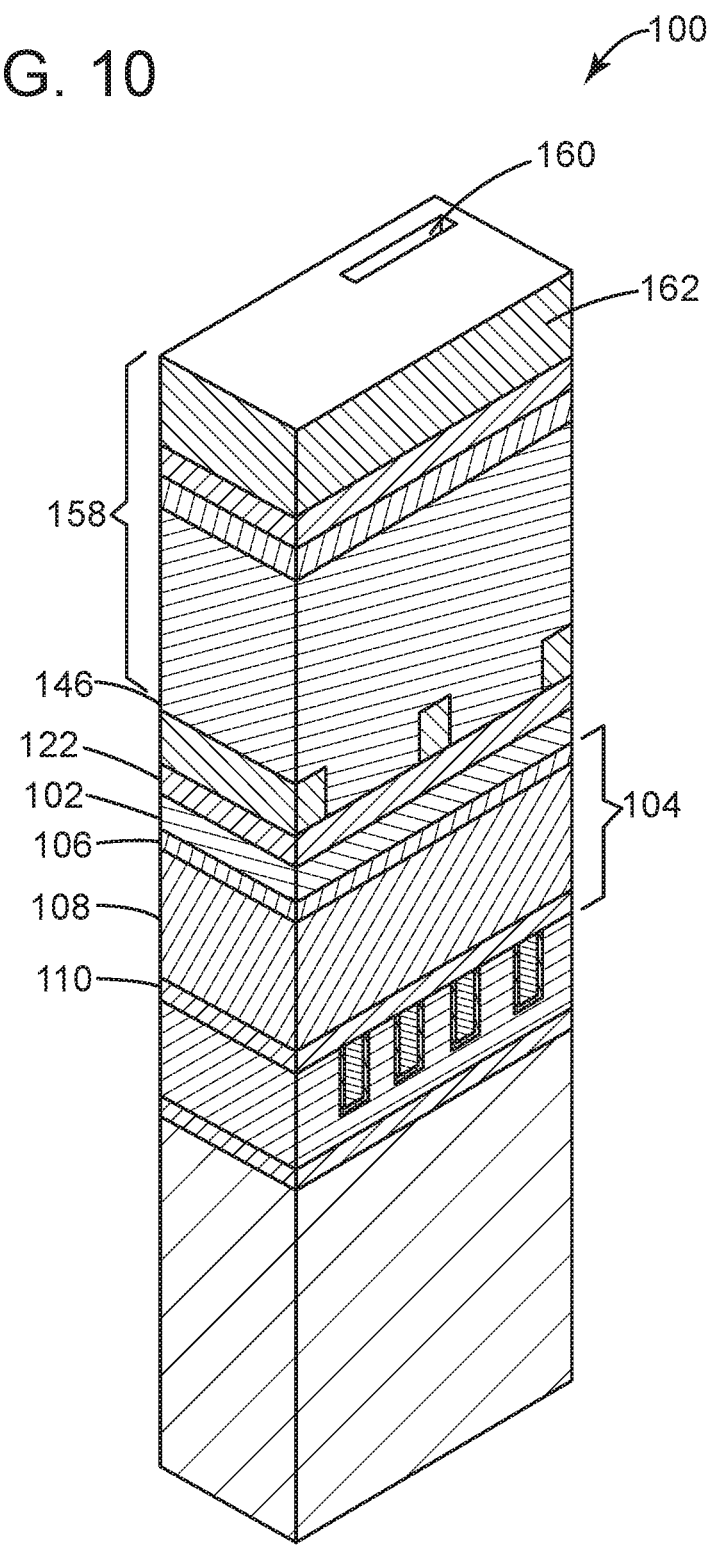
FIG. 10 is a perspective view of an exemplary embodiment of the structure of FIG. 9A having a lithographic stack with a second cut patterned therein in accordance with the present invention.

Referring to FIG. 10, a third lithographic stack 158 is disposed over the structure 100. A second cut 160 is then patterned into a predetermined location of resist layer 162 of the stack 158.

Figure 11B:
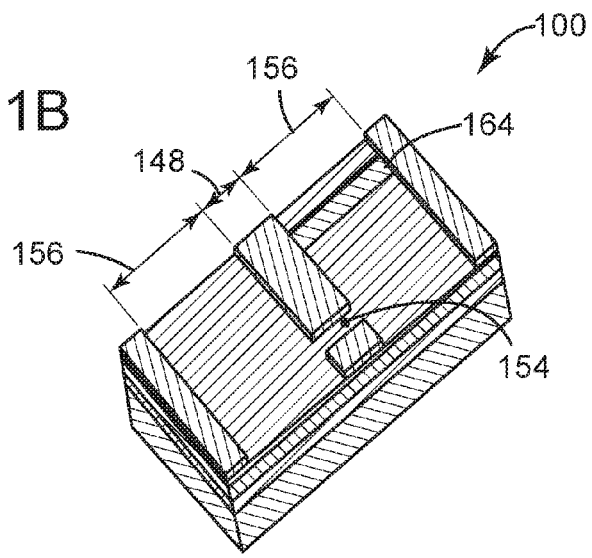
FIG. 11B is a perspective top view of FIG. 11A.
Figure 11A:
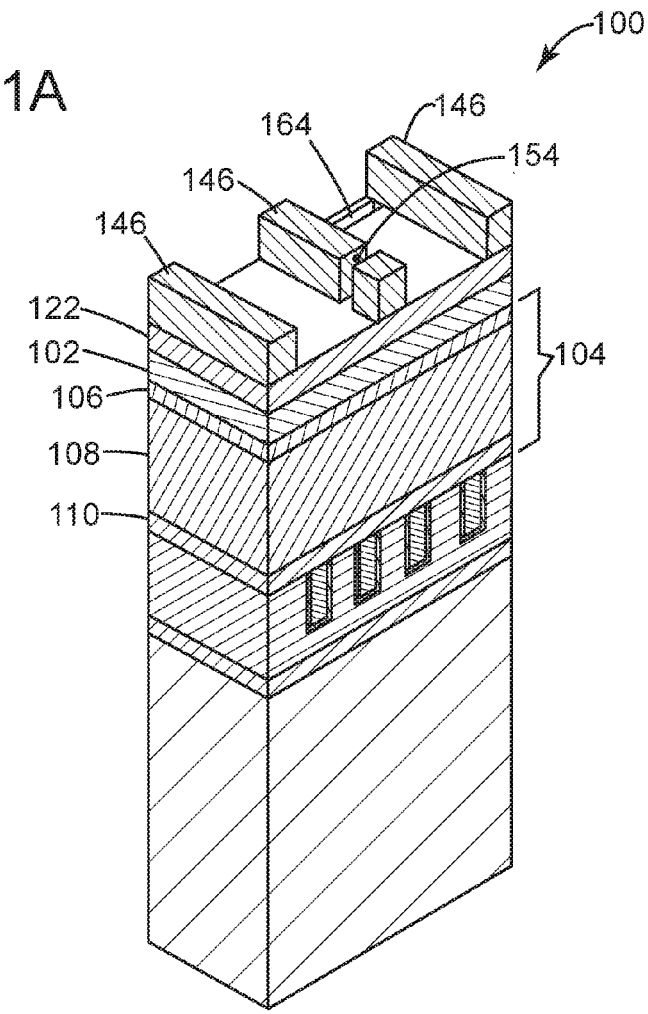
FIG. 11A is a perspective view of an exemplary embodiment of the structure of FIG. 10 having a gamma trench in the etch mask layer in accordance with the present invention.

Referring to FIGS. 11A and B, once the third lithographic process is complete and the cut 160 is notched into the resist layer 162, another anisotropic etch process is utilized to selectively etch a gamma trench 164 entirely in the etch masks layer 122. More precisely the gamma trench 164 is etched in the exposed area of etch mask layer 122 between the mandrels 146. The gamma trench 164 is located such that it overlays the gamma block mask portion 130 of pattern 124 in the pattern layer 102 (best seen in FIG. 5). The gamma block mask portion 130 will ultimately be utilized to form an electrical continuity block (a gamma block) to a gamma interconnect line in the low k dielectric layer 108 of dielectric stack 104. Note that, in this example, the gamma interconnect lines are to be substantially 20 nm in width. Therefore as discussed previously, it is critical that the gamma trench 164 be precisely located such that it does not over extend into neighboring interconnect lines.

Again however, because the material composition of the mandrels 146 and etch mask layer 122 are different, the etching process which formed beta trench 164 can be selected such that it affects only the SiN etch mask layer 122 and not the a-Si mandrels 146. Further, as will be explained in detail herein, the beta trench 164 does not have to be held to the precise width of the interconnection lines it will ultimately form, which is 20 nm in this example. Rather the beta trench 164 can be allowed to overextend past the 20 nm width of the interconnection lines. However, the overlay control of the lithographic process, which was used to size and locate the gamma trench 164, must be accurate enough to prevent the etching process from over extending past the entire width 156 of the exposed etch mask layer 122 between mandrels 146 plus the width 148 of the two adjacent mandrels 146.

Advantageously again, since the pitch 147 at this stage of the process is 80 nm, it is well within the state of the art of conventional lithographic overlay control to prevent such over extension. More specifically, for this example, the pitch 147 is 80 nm, the mandrel width 148 is 20 nm, and the exposed etch mask width 156 is 60 nm. Therefore the total span that can be allowed for the etching process of gamma trench 164 is the exposed etch mask width 156 plus twice the mandrel width 147, or 100 nm (i.e., 60 nm gamma trench plus 20 nm mandrel plus 20 nm mandrel). This allows for an overextension tolerance of 40 nm on either side of a targeted 20 nm etch (20 nm being the ideal width of the gamma trench 164 and the associated underlying gamma block mask portion 132 to be formed in the pattern layer 102), which is well within the control of a state of the art lithographic process.

Though this exemplary embodiment shows a single gamma trench 164 being etched entirely into the etch mask layer 122, one skilled in the art would recognize that a plurality of gamma trenches may be etched into the etch mask layer 122. This can be particularly helpful when gamma blocks must be constructed in an electrical interconnection system wherein they are separated by only a small distance, such as 100 nm or less. In such cases, multiple gamma trenches (for example a first gamma trench and a parallel second gamma trench) may be etched into the etch mask layer 122 wherein the trenches are separated by a distance of 100 nm or less.

Figure 12:
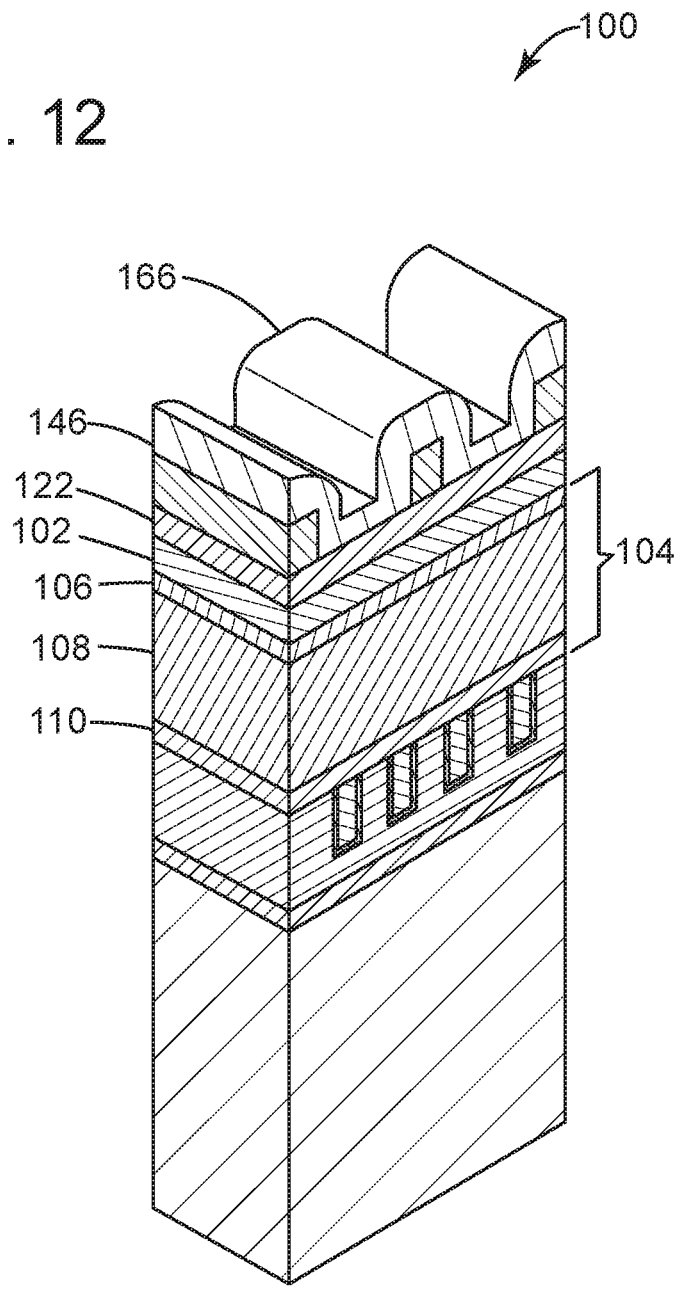
FIG. 12 is a perspective view of the structure of FIG. 11A having a spacer layer disposed thereon in accordance with the present invention.

Referring to FIG. 12, a spacer layer 166 is disposed over the structure 100. The spacer layer 166, in this example, is a silicon dioxide (SiO2) thin film, which is conformally coated over the mandrels 146 and exposed etch mask layer 122. The SiO2 material composition of the spacer layer 166 was chosen to be different from that of the mandrel layer 120 and etch mask layer 122. Other materials for the spacer layer 166 may also be used. However, it is highly desirable that the material composition of the spacer layer 166 be different enough to enable selective etching between any combination of the mandrel layer 120 (and therefore the mandrels 146), the etch mask layer 122 and the spacer layer 166.

It is important to note that the spacer layer fills the beta and gamma trenches 154, 164 with SiO2, forming (best seen in FIG. 13A and FIG. 13B) a beta trench plug 168 in the beta trench 154 and a gamma trench plug 170 in the gamma trench 164. The spacer layer 166 can be applied by a deposition process, such as an atomic layer deposition (ALD) process, which can precisely control the film thickness. In this embodiment, the film thickness is controlled to substantially 20 nm.

Figure 13A:
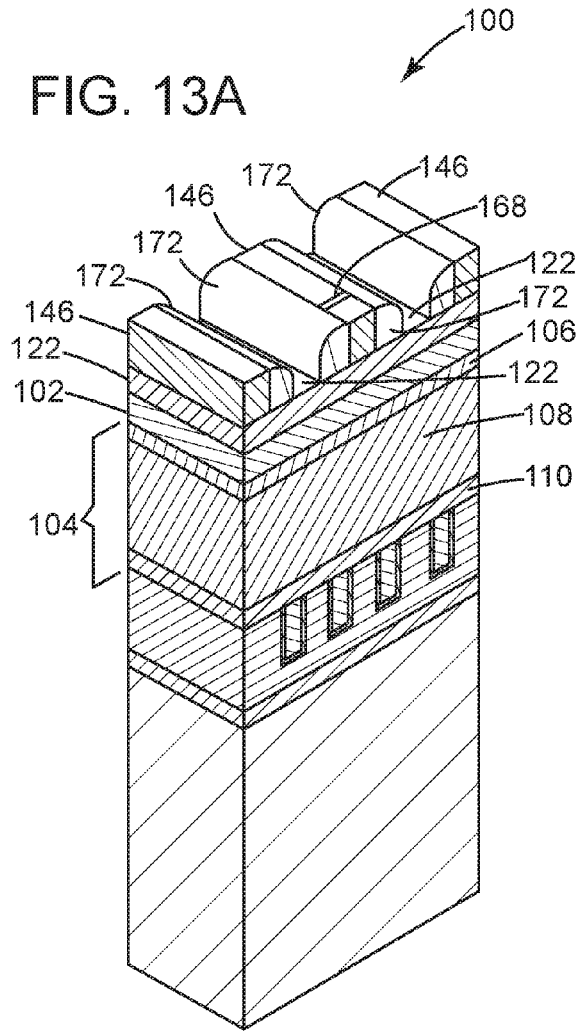
FIG. 13A is a perspective view of the structure of FIG. 12 having the spacer layer anisotropically etched in accordance with the present invention.
Figure 13B:
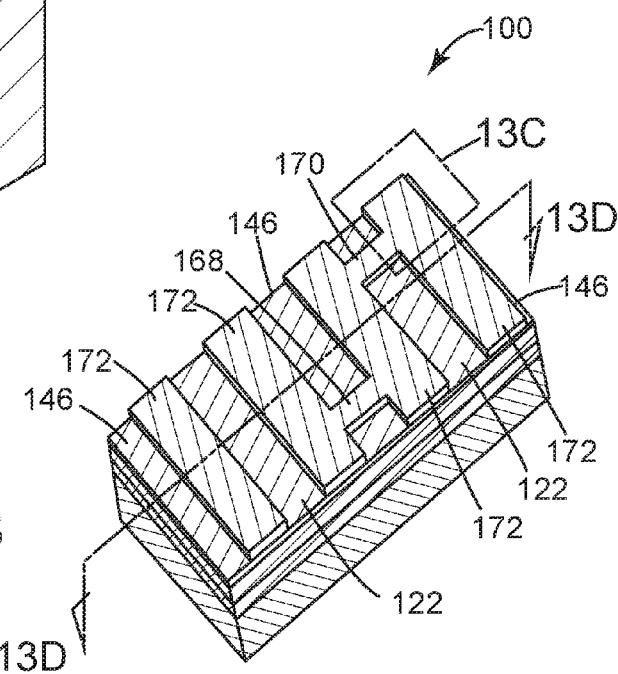
FIG. 13B is a perspective top view of FIG. 13A.
Figure 13C:
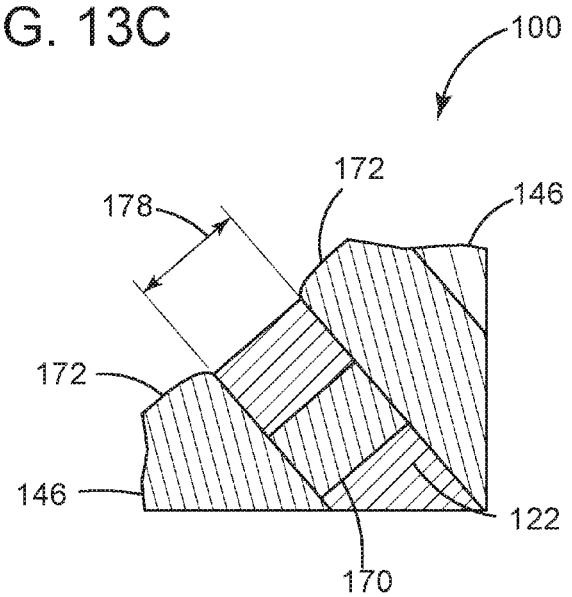
FIG. 13C is an expanded view of the area labeled 13C in FIG. 13B.
Figure 13D:
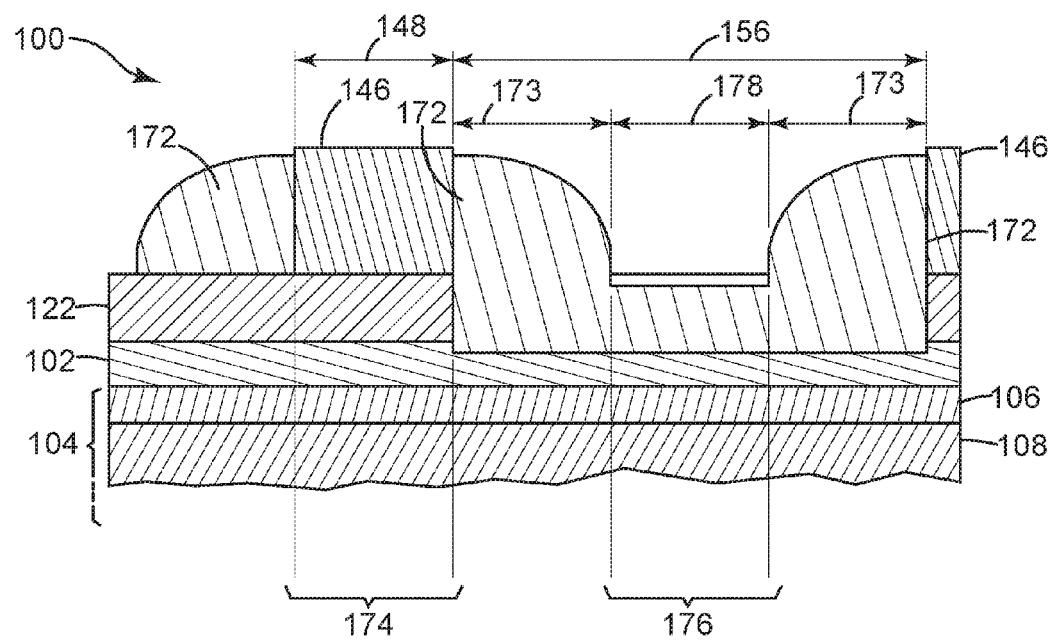
FIG. 13D is a cross sectional side view of FIG. 13B taken along the cross sectional line 13D-13D.

Referring to FIGS. 13A, B, C and D, wherein: FIG. 13A is a perspective view of the structure 100 of FIG. 12 after being anisotropically etched; FIG. 13B is a perspective top view of FIG. 13A; FIG. 13C is an expanded view of the area labeled 13C in FIG. 13B; and FIG. 13D is a cross sectional side view of FIG. 13B taken along the cross sectional line 13D-13D. The spacer layer 166 is anisotropically etched, such as by a RIE process, to expose a portion of the top surface of the etch mask layer 122 and to expose the upper surface of the mandrels 146. The anisotropic etch also exposes portions of the beta trench plug 168 and the gamma trench plug 170, which overlay and define the beta 132 and gamma 130 block mask portions of the pattern layer 102.

Further the anisotropic etching process forms an array of spacers 172 disposed on sidewalls of the mandrels 146. Since the anisotropic etching process etches in the vertical direction only, the remaining spacers have a width 173 that is substantially equal to the original spacer layer thickness of 20 nm.

As best seen in FIG. 13D, the spacers 172 and mandrels 146 define alternating beta regions 174 and gamma regions 176, which extend normally (perpendicularly) through the dielectric stack 104. The beta regions 174 include the beta block mask portion 132 of the pattern 124 in the pattern layer 102 and the gamma regions 176 include the gamma block mask portion 130 of the pattern 124 in the pattern layer 102.

More specifically, the beta regions 174 extend through the mandrels 146 and have a width, which is equal to the mandrel width 148. The beta regions extend through and define the locations 128 of beta interconnect lines in pattern 124 (best seen in FIG. 5). In this particular example, since the mandrels 146 have a set width of 20 nm, the beta regions (and the interconnect lines within them) will also have a width of 20 nm. Further, the beta trench plug 168, which overlays and defines the beta block mask portion 132 of the pattern 124, is also in the beta region 174 and is also 20 nm wide.

Also more specifically, the gamma regions 176 extend through the exposed portions of the etch mask layer 122 which are absent any overlaying spacers 172 or mandrels 146. The gamma regions have a width 178, which is equal to the distance 156 between the mandrels 146 minus twice the spacer width 173. In this exemplary embodiment, since the pitch is 80 nm and the mandrels are 20 nm, then the distance 156 between mandrels is 60 nm (80 nm pitch minus 20 nm mandrel width). Also, since the spacer width 173 has been controlled to 20 nm, the gamma region width 178 is also 20 nm (60 nm distance between mandrels minus twice the 20 nm spacer width).

It is important to note that any overextension of the gamma trench 164, and therefore its associated gamma trench plug 170, due to lithographic overlay tolerances has now been covered up by the spacers 172. As a result, the exposed portion of the gamma trench plug 168, which overlays and defines the gamma block mask portion 130 of the pattern 124, is solely in the gamma region 176 and is, therefore, also 20 nm in width. In this way, the exposed portion of the gamma trench plug 170 can be considered to be self-aligned with the gamma region 176.

Referring to FIGS. 14A and B, the a-Si mandrels 146 are selectively etched away, leaving only the SiN spacers 172, the SiO2 beta trench plug 168 and the SiO2 gamma trench plug 170. As discussed earlier, because of the differences in material composition between mandrels 146, spacers 172 and trench plugs 168, 170, the mandrels may be etched away without damaging the spacers and trench plugs. The result of the etching process is that the pattern 124 (as originally shown in FIG. 5) has emerged over the etch mask layer 122.

Also, with the removal of the mandrels 146, the pitch of the array of spacers 172 on structure 100 is now half the pitch of that of the array of mandrels. That is, the pitch has been halved from 80 nm to 40 nm on the structure 100. Though this example shows a mandrel pitch of 80 nm and a spacer pitch of 40 nm, one skilled in the art would recognize that this method of forming a pattern may be used with other pitches. For example, the mandrel array may have a pitch of 100 nm or less, and the spacer array may have a pitch of 50 nm or less.

Figure 16B:
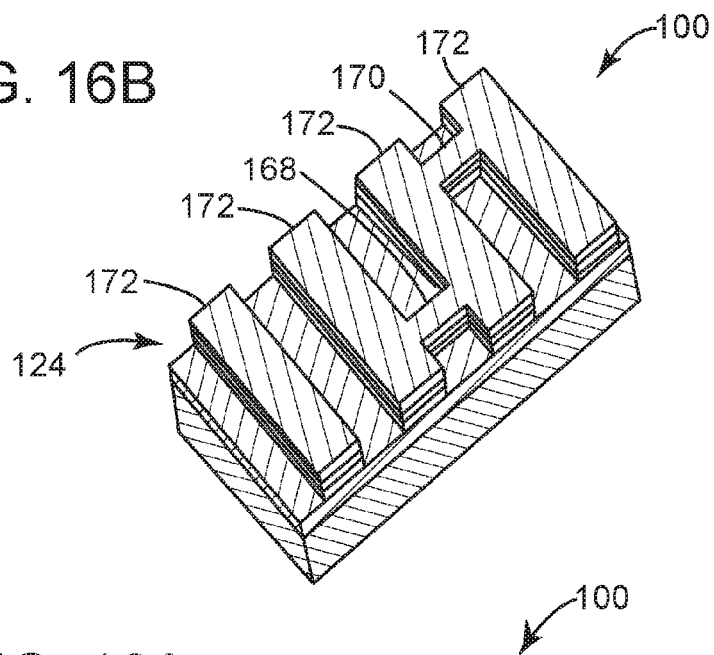
FIG. 16B is a top perspective view of FIG. 16A.
Figure 16A:
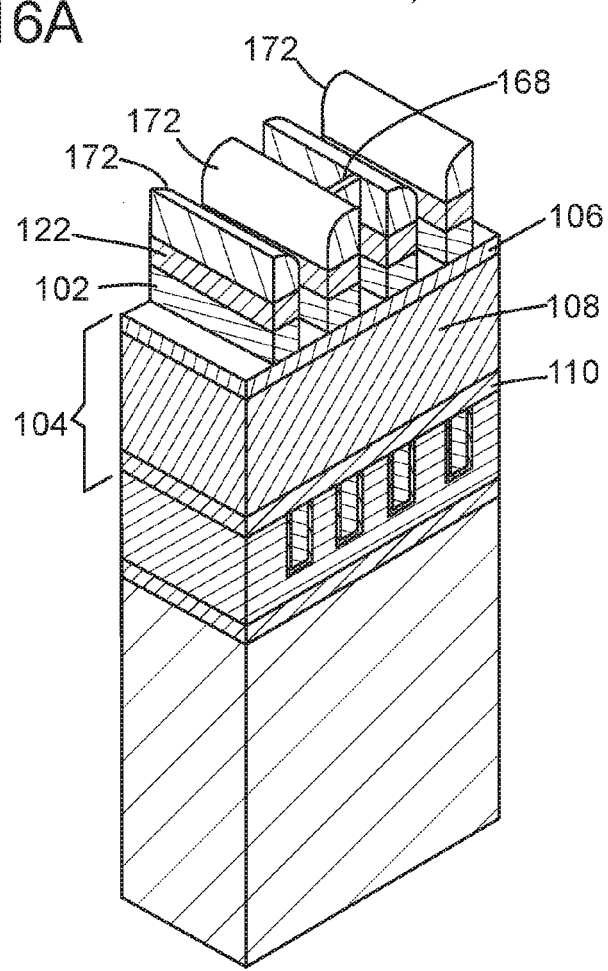
FIG. 16A is a perspective view of the structure of FIG. 15A having the exposed portion of the pattern layer anisotropically etched away in accordance with the present invention.

Referring to FIGS. 15A and B, the exposed portions of etch mask layer 122 is now anisotropically etched away so that the pattern 124 now is over the pattern layer 102. Referring next to FIGS. 16A and B, the exposed portions of pattern layer 102 is anisotropically etched away to form the pattern 124 in the remaining unexposed portion of the pattern layer 102 and directly over the dielectric stack 104.

An added benefit to this method of forming the pattern 124 is that the sequential selective etching of the structure 100 to remove the a-Si mandrels 146, the exposed portions of the SiN etch mask layer 122 and the exposed portions of the TiN pattern layer may be accomplished in a single integrated etch process. That is, through well-known RIE techniques, the composition of the reactive plasma of the RIE process can be changed as it penetrates through the mandrels 146, the etch mask layer 122 and the pattern layer 102 to stop at the first dielectric layer 106 at the top of the dielectric stack 104.

At this point in the process we are ready to etch the pattern 124 to form beta and gamma line trenches in the beta and gamma regions 174, 176 respectively of the dielectric stack 104. Additionally a beta dielectric block will be formed across a beta line trench from the beta block mask portion 132 of the pattern 124. Further a gamma dielectric block will be formed across a gamma line trench from the gamma block mask portion 130 of the pattern 124. At that point metal will be dispose in the gamma and beta line trenches to form an array of alternating parallel gamma and beta interconnection lines. The beta dielectric block will extend across a beta interconnect line without extending into a gamma interconnect line and the gamma dielectric block will extend across a gamma interconnect line without extending into a beta interconnect line.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A method comprising:
    providing a structure having a mandrel layer disposed over an etch mask layer, the etch mask layer being disposed over a pattern layer and the pattern layer being disposed over a dielectric stack;
    patterning an array of mandrels in the mandrel layer;
    selectively etching a beta trench entirely in a mandrel of the array, the beta trench overlaying a beta block mask portion of a pattern in the pattern layer;
    selectively etching a gamma trench entirely in the etch mask layer, the gamma trench overlaying a gamma block mask portion of the pattern in the pattern layer;
    disposing a spacer layer over the structure, the spacer layer forming a beta trench plug in the beta trench and a gamma trench plug in the gamma trench;
    anisotropically etching the spacer layer to expose portions of the beta and gamma trench plugs, and form an array of spacers disposed on sidewalls of the mandrels,
        wherein the exposed portions of the beta and gamma trench plugs define the beta and gamma block mask portions of the pattern, and
        wherein the spacers and mandrels define alternating beta and gamma regions extending normally through the dielectric stack, the beta region including the beta block mask portion of the pattern, the gamma region including the gamma block mask portion of the pattern, the beta region extending through the mandrels, and the gamma region extending through the portions of the etch mask layer which are absent any overlaying spacers and mandrels; and
    selectively etching the structure to form the pattern in the pattern layer.

2. The method of claim 1 comprising:
    etching the pattern to:
        form gamma and beta line trenches in the gamma and beta regions respectively of the dielectric stack,
        form a beta dielectric block across a beta line trench from the beta block mask portion of the pattern, and
        form a gamma dielectric block across a gamma line trench from the gamma block mask portion of the pattern; and
    disposing metal in the gamma and beta line trenches to form an array of alternating parallel gamma and beta interconnection lines;
    wherein the beta dielectric block extends across a beta interconnect line without extending into a gamma interconnect line and the gamma dielectric block extends across a gamma interconnect line without extending into a beta interconnect line.

3. The method of claim 1 wherein selectively etching a beta trench entirely in a mandrel of the array comprises selectively etching a first beta trench and a parallel second beta trench entirely in the mandrel, the first and second beta trenches being separated by a distance of 100 nm or less.

4. The method of claim 1 wherein selectively etching a gamma trench entirely in the etch mask layer comprises selectively etching a first gamma trench and a parallel second gamma trench entirely in the etch mask layer, the first and second gamma trenches being separated by a distance of 100 nm or less.

5. The method of claim 1 wherein the array of mandrels have a pitch of 100 nm or less.

6. The method of claim 1 wherein the array of spacers have a pitch that is half the pitch of the array of mandrels.

7. The method of claim 1 wherein the array of spacers have a pitch that is 50 nm or less.

8. The method of claim 1 wherein the mandrel layer, etch mask layer and spacer layer are composed of different materials.

9. The method of claim 8 wherein the mandrel layer, etch mask layer and spacer layer are composed of one of a silicon nitride, an amorphous silicon and a silicon oxide.

10. The method of claim 1 comprising:
the beta region having a width equal to the mandrel width; and
the gamma region having a width equal to the distance between the mandrels minus twice the spacer width.

11. The method of claim 1 comprising:
selectively etching the structure to remove the mandrels;
selectively etching the structure to remove exposed portions of the etch mask layer; and
selectively etching the structure to remove exposed portions of the pattern layer to form the pattern.

12. The method of claim 11 wherein selectively etching the structure to remove the mandrels, selectively etching the structure to remove exposed portions of the etch mask layer and selectively etching the structure to remove exposed portions of the pattern layer comprise a single integrated etch process.

13. A method comprising:
providing a structure having a mandrel layer disposed over an etch mask layer, the etch mask layer being disposed over a pattern layer and the pattern layer being disposed over a dielectric stack;
patterning an array of mandrels in the mandrel layer;
selectively etching a beta trench entirely in a mandrel of the array, the beta trench overlaying a beta block mask portion of a pattern in the pattern layer;
selectively etching a gamma trench entirely in the etch mask layer, the gamma trench overlaying a gamma block mask portion of the pattern in the pattern layer;
disposing a spacer layer over the structure, the spacer layer forming a beta trench plug in the beta trench and a gamma trench plug in the gamma trench;
anisotropically etching the spacer layer to expose the beta and gamma trench plugs, and form an array of spacers disposed on sidewalls of the mandrels, wherein:
the exposed portions of the beta and gamma trench plugs define the beta and gamma block mask portions of the pattern, and
the spacers and mandrels define alternating beta and gamma regions extending normally through the dielectric stack, wherein:
the beta region extends through the mandrels, the beta region has a width equal to the mandrel width, and the beta region includes the beta block mask portion of the pattern, and
the gamma region extends through the portions of the etch mask layer which are absent any overlaying spacers and mandrels, the gamma region has a width equal to the distance between the mandrels minus twice the spacer width, and the gamma region includes the gamma block mask portion of the pattern; and
selectively etching the structure to form the pattern in the pattern layer.

14. The method of claim 13 comprising selectively etching one of:
a first beta trench and a parallel second beta trench entirely in the mandrel, wherein the first and second beta trenches are separated by a distance of 100 nm or less; and
a first gamma trench and a parallel second gamma trench entirely in the etch mask layer, wherein the first and second gamma trenches are separated by a distance of 100 nm or less.

15. The method of claim 13 wherein the mandrel layer, the etch mask layer and the spacer layer are composed of materials that are different from each other.

16. The method of claim 13 comprising:
selectively etching the structure to remove the mandrels;
selectively etching the structure to remove exposed portions of the etch mask layer; and
selectively etching the structure to remove exposed portions of the pattern layer to form the pattern.

17. The method of claim 16 comprising:
etching the pattern to:
form gamma and beta line trenches in the gamma and beta regions respectively of the dielectric stack,
form a beta dielectric block across a beta line trench from the beta block mask portion of the pattern, and
form a gamma dielectric block across a gamma line trench from the gamma block mask portion of the pattern; and
disposing metal in the gamma and beta line trenches to form an array of alternating parallel gamma and beta interconnection lines;
wherein the beta dielectric block extends across a beta interconnect line without extending into a gamma interconnect line and the gamma dielectric block extends across a gamma interconnect line without extending into a beta interconnect line.

* * * * *